(12) United States Patent
Dibene, II et al.

(10) Patent No.: US 6,243,269 B1
(45) Date of Patent: Jun. 5, 2001

(54) CENTRALIZED COOLING INTERCONNECT FOR ELECTRONIC PACKAGES

(75) Inventors: Joseph T. Dibene, II, Oceanside; Gang Wang; P. Keith Muller, both of San Diego, all of CA (US)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 09/222,413

(22) Filed: Dec. 29, 1998

(51) Int. Cl.⁷ ................................................ H05K 7/20
(52) U.S. Cl. ..................... 361/720; 361/722; 361/796; 174/15.2; 257/713
(58) Field of Search ..................... 361/699, 700, 361/704, 707, 717–722, 816, 688, 792, 794, 692; 174/15.2, 16.3, 252; 165/80.3, 80.4, 185, 104.33, 104.34; 257/713, 714, 715–722; 438/122; 29/846; 156/275.3, 150, 151, 275.5, 275.7

(56) References Cited

U.S. PATENT DOCUMENTS

| | | | |
|---|---|---|---|
| 4,509,096 | * 4/1985 | Baldwin et al. | 361/386 |
| 4,689,262 | * 8/1987 | Bloom | 428/201 |
| 4,689,442 | * 8/1987 | Ozaki | 174/68.15 |
| 4,866,571 | * 9/1989 | Butt | 361/386 |
| 5,195,021 | * 3/1993 | Ozmat | 361/386 |
| 5,198,693 | * 3/1993 | Imken et al. | 257/720 |
| 5,199,165 | * 4/1993 | Crawford et al. | 29/846 |
| 5,375,039 | * 12/1994 | Wiessa | 361/720 |
| 5,513,070 | * 4/1996 | Xie et al. | 361/700 |
| 5,640,048 | * 6/1997 | Selna | 257/738 |
| 5,792,677 | * 8/1998 | Reddy et al. | 438/122 |
| 5,851,337 | * 12/1998 | Chen | 156/275.3 |
| 5,933,324 | * 8/1999 | Barrett | 361/703 |
| 6,008,987 | * 12/1999 | Gale | 361/700 |

* cited by examiner

Primary Examiner—Leo P. Picard
Assistant Examiner—Michael Datskovsky
(74) Attorney, Agent, or Firm—Gates & Cooper; John D. Cowart

(57) ABSTRACT

An apparatus for centralizing heat dissipation on printed circuit boards is disclosed. The printed circuit board materials are used to thermally conduct heat from a circuit that generates heat to a heat sink. The heat sink can be the layer on the printed circuit board, conductive paths on a layer of a printed circuit board, or the layers of the printed circuit board can be used to thermally couple the heat generating circuit to an external, remote heat sink for heat dissipative purposes.

8 Claims, 3 Drawing Sheets

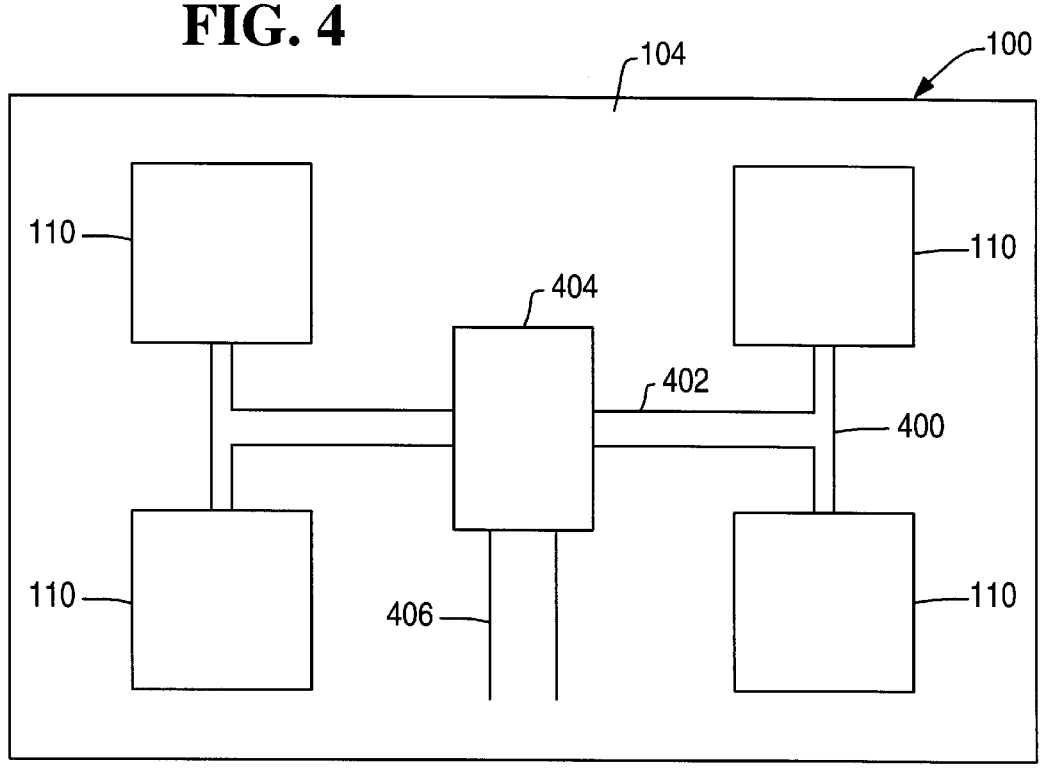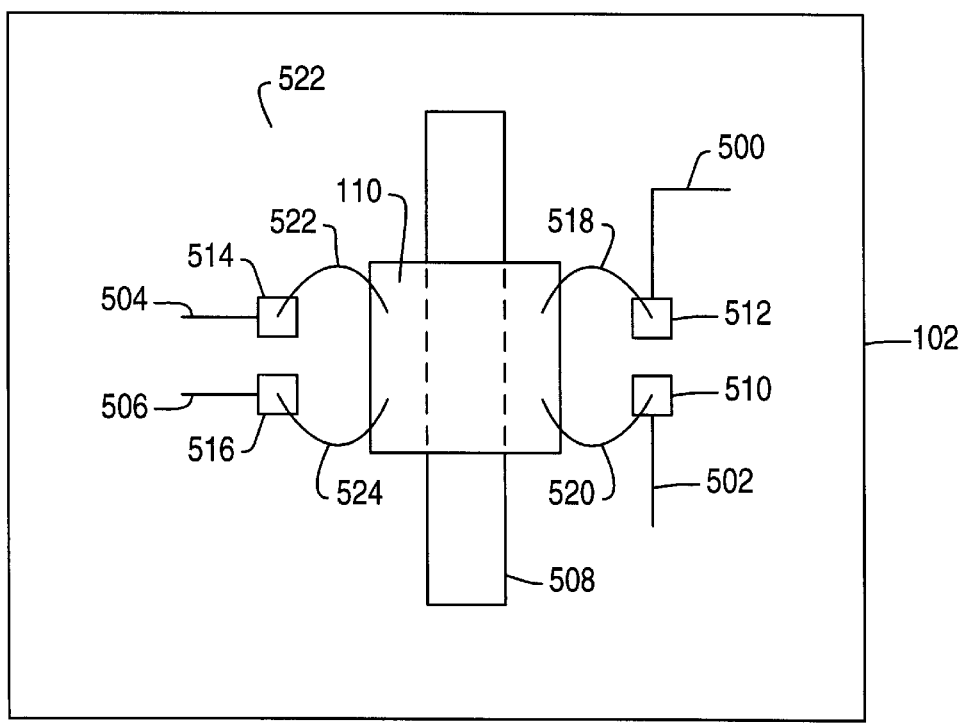

CENTRALIZED COOLING INTERCONNECT FOR ELECTRONIC PACKAGES

BACKGROUND OF THE INVENTION

1. Field of the Invention

This invention relates in general to printed circuit board manufacturing, and in particular, to a centralized cooling interconnect for multiple electronic packages.

2. Description of Related Art

As circuitry in electronics becomes more and more complex, packaging of the circuitry has become more difficult. The use of Printed Circuit Boards (PCBs) has made packaging of integrated circuits and other electronic components easier and efficient.

The density of PCBs is limited by many factors. PCB area, or "real estate," has a high premium during the design process, because the PCB real estate cannot be increased for a given PCB size. PCBs are routinely stacked next to each other in card cages, electronic modules, and in other electronic applications. However, the thermal considerations of the electronics act as a barrier to even denser electronic packaging density.

Thermal considerations are routinely overcome by attaching heat dissipative devices, such as finned heat sinks, etc., to individual chips to dissipate heat. However, these heat sinks take up additional room in card cages and electronic modules, and therefore invade the space that other PCBs can occupy, therefore reducing packaging density in the card cage.

As PCB real estate becomes more valuable, designers have started to find ways to reduce the real estate each component occupies. One method for doing this is to remove the die carrier, e.g., the black plastic or ceramic package that is used to make the handling of semiconductor dies easier, from the design. The die that is located within a die carrier is typically much smaller than the carrier itself, and therefore takes up less PCB real estate than the same die with the die carrier attached.

It can be seen, then, that there is a need in the art for a method for dissipating heat in addition to the use of heat sinks. Further, there is a need for heat dissipative devices that take up less real estate or, alternatively, real estate that is more planar with the PCB.

SUMMARY OF THE INVENTION

To overcome the limitations in the prior art described above, and to overcome other limitations that will become apparent upon reading and understanding the present specification, the present invention discloses an apparatus for cooling electronic modules mounted on printed circuit boards. The apparatus comprises a thermal conduction path having one end thermally coupled to a electrical component for conducting heat away from the electronic module. The thermal conduction path comprises a thermally conductive material on the printed circuit board. The other end of the thermal conductive path is coupled to a heat dissipating module such as a heat sink for dissipation of the heat generated by the electrical component into a coolant such as cooling air or cooling liquid.

An object of the present invention is to provide more efficient usage of printed circuit board real estate. Another benefit is higher packaging density without thermal overload of the resultant system.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to the accompanying detailed description, in which there is illustrated and described specific examples of a method, apparatus, and article of manufacture in accordance with the invention.

BRIEF DESCRIPTION OF THE DRAWINGS

Referring now to the drawings in which like reference numbers represent corresponding parts throughout:

FIG. 4 illustrates another embodiment of the present invention; and

FIG. 5 illustrates a two-layer printed circuit board embodiment of the present invention.

DETAILED DESCRIPTION OF THE PREFERRED EMBODIMENT

In the following description of the preferred embodiment, reference is made to the accompanying drawings which form a part hereof, and in which is shown byway of illustration a specific embodiment in which the invention may be practiced. It is to be understood that other embodiments may be utilized and structural changes may be made without departing from the scope of the present invention.

Overview

The present invention discloses an apparatus for cooling electronic modules mounted on printed circuit boards. The apparatus comprises a thermal conduction path having one end thermally coupled to an electrical component for conducting heat away from the electronic module. The thermal conduction path comprises a thermally conductive material on the printed circuit board. The other end of the thermal conductive path is coupled to a heat dissipative device for dissipation of the heat generated by the electronic module.

Printed Circuit Board Illustration

Figure 1A:
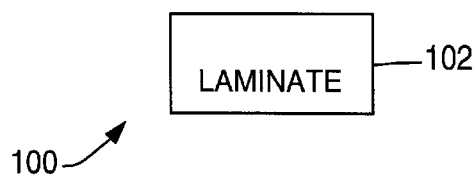
FIGS. 1A–1E illustrate the construction of a printed circuit board using the present invention.

FIGS. 1A–1E illustrate the construction of a printed circuit board using the present invention. FIG. 1A illustrates PCB 100 layer 102. Layer 102 is typically a laminate material, typically fiberglass or other dielectric material, that is electrically non-conductive. Layer 102 acts as a mechanical support for the remainder of the PCB 100.

Figure 1B:
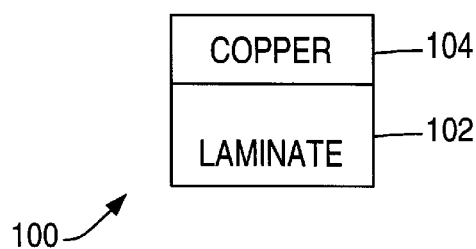

FIG. 1B illustrates layer 104 being added to one side of layer 102 of the PCB 100. Layer 104 is typically an electrically conductive layer, such as copper, but can be other materials. Layer 104 can also serve as both an electrically conductive layer and a thermally conductive layer, wherein the electrically conductive portions of layer 104 are electrically disconnected from and isolated from the thermally conductive portions of layer 104. Layer 104 can be coupled to layer 102 by several means, e.g., compression, deposition, or other coupling techniques. Layer 104 can also be etched to selectively remove portions of layer 104 to produce electrical traces, pads, etc. Although the areas of layer 104 are typically used to conduct electricity, the present invention uses these areas to conduct heat from one portion of layer 104 to another, or from layer 104 to another layer in the PCB 100.

Figure 1C:
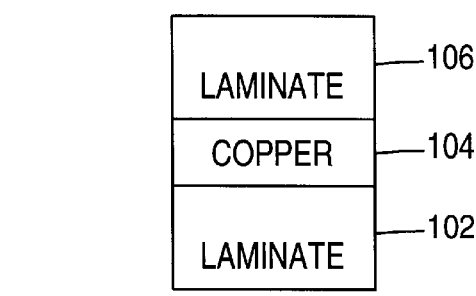

FIG. 1C illustrates a second laminate layer 106 being added to layer 104. Layer 106 insulates layer 104 from other layers, such that conductive paths on layer 104 can cross over conductive paths on other layers of the PCB 100 without electrically connecting the conductive paths on layer 104 in an unwanted manner. The conductive paths on layer 104 can take many forms, e.g., the entire layer 104, a portion of layer 104, a trace or multiple traces on layer 104, a pattern etched into layer 104, or incorporate heat pipes into layer 104 to make layer 104 thermally conductive. Similarly, the present invention can thermally isolate conductive paths on layer 104 from thermal conductive paths on other layers of the PCB 100 if desired. The build up of alternate layers of conductive and non-conductive materials can continue for several layers as desired to complete the PCB 100. For illustrative purposes only, the PCB 100 is shown with only one conductive layer 104 sandwiched between layers 102 and 106.

Figure 1D:
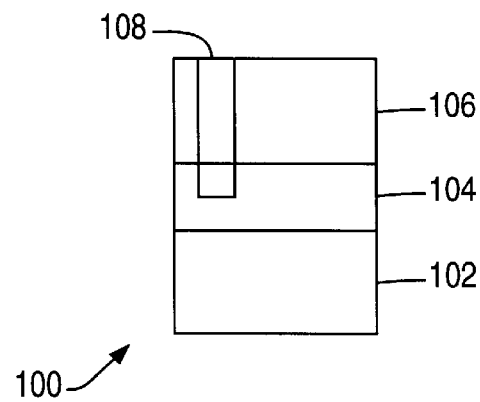

FIG. 1D illustrates a via 108 that is used to thermally couple a component placed on the top of layer 106 with layer 104. A via is typically used to connect two layers on a PCB 100 electrically. The present invention uses via 108 to couple the top and bottom of layer 106, which is typically a dielectric or insulating layer, in a thermal fashion. Via 108 is typically filled with an electrically conductive material, such as copper, to allow electrons to flow along the electrically conductive path. The present invention uses a thermally conductive material, which can also be copper, to allow thermal energy to flow from one end of the via to another. The use of a thermal path distinct from an electrical path on PCB 100 allows for heat dissipation on a conductive path of layer 104 using via 108.

Figure 1E:
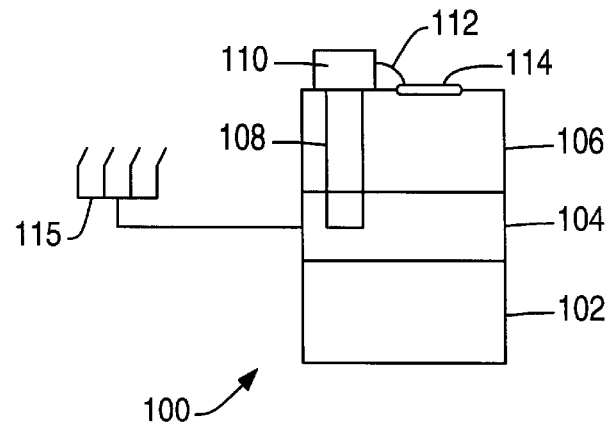

FIG. 1E illustrates an electrical component 110 mounted to the top of layer 106. Component 110 can be an integrated circuit (IC), a die-level circuit, or any other type of electrical component that requires heat dissipation. Component 110 sits atop via 108, which uses the bottom of component 110 to conduct heat away from component 110 to layer 104. In some embodiments, layer 104 is coupled to a remote heat-dissipating module 115, such as a heat sink, for dissipating the heat generated by the component 10 into a coolant, such as air or a cooling liquid. The electrical connections 112, typically wire bonds, are made on the top level of layer 106. Layer 104 is thus used to conduct the heat away from component 110 while connections 112 are used to electrically couple component 110 to conductive path 114 on layer 106. This shows that component uses connection 112 and conductive path 114 to carry electrical energy or information, such as signals, etc., distinct from the thermal energy, which flows through via 108 to layer 104.

Layer 104 can also be used as both a thermal and an electrical conductor layer. For example, some of the conductive paths on layer 104 can be used to conduct electrical signals, while other conductive paths on layer 104 can be used to conduct thermal energy from one place on the PCB 100 to another place on PCB 100. This is performed by etching or selectively removing portions of layer 104 and designing the remaining portions of layer 104 accordingly, i.e., some of the remaining portions are used for transmitting thermal energy, while other remaining portions are used for transmitting electrical energy from one location on PCB 100 to another location on PCB 100.

Although PCBs 100 use conductive paths to electrically connect components together, and, because of the movement of electrons within the electrical conductive paths carries heat (as an IR loss), the conductive paths, vias 108, and layers 104 are not designed to cany thermal energy in the absence of electrical signals. The present invention overcomes this limitation by designing conductive paths, vias 108, and layers 104 to cany thermal energy distinct from electrical signals. This aspect of the present invention allows for further design capabilities for PCBs 100, and allows designers to centralize or homogenize the heat loads of a PCB 100 where necessary or desired.

Operation of the Thermal Layer

Figure 2:
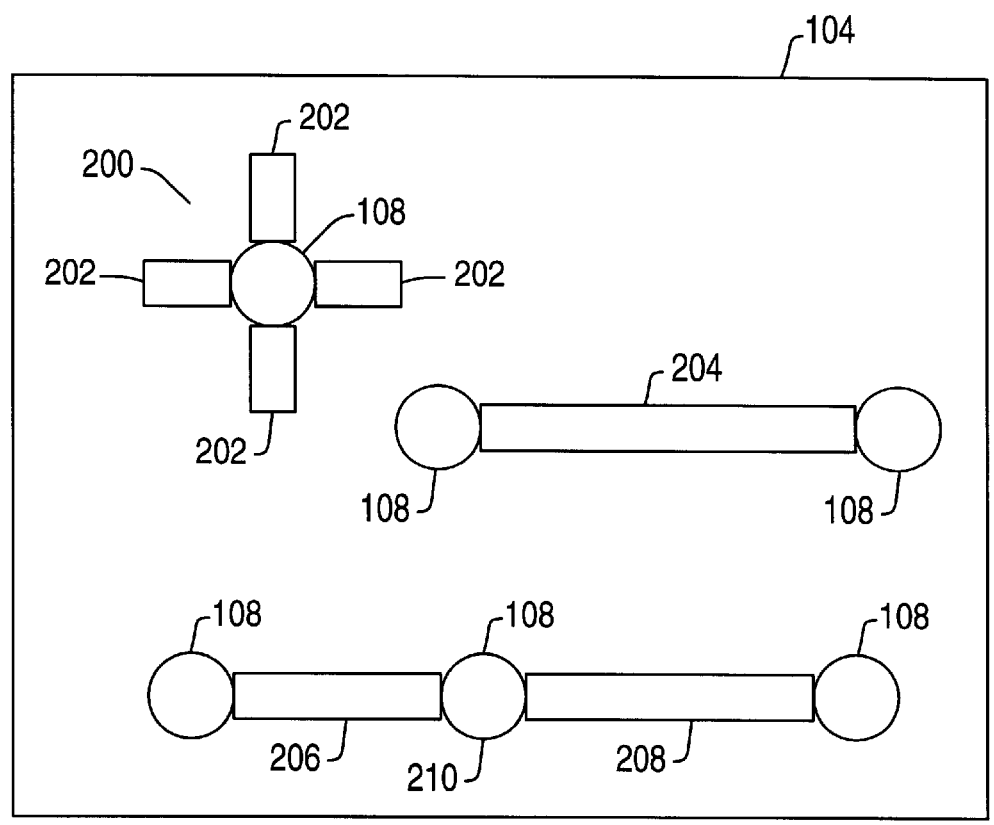
FIG. 2 illustrates several possible operations of the thermal layer of the present invention.

FIG. 2 illustrates several possible operations of the thermal layer of the present invention.

Layer 104 can be used as a thermal layer alone, or a thermal layer in conjunction with an electrical layer, within PCB 100. For example, conductive path 200 shows via 108 (top view) connected to conductive paths 202. Conductive paths 202 are not electrically connected to any other component of PCB 100, but act as heat fins for the component 110 that is mounted above or below via 108. Conductive paths 202 provide a thermal mass that dissipates heat for component 110 that is mounted on conductive paths 202.

At the same time, conductive path 204 can connect two vias 108 together. Typically, this is done to electrically couple two components 110 together. However, the present invention uses conductive path 204 to thermally couple two components together distinct from coupling two components together electrically. This can be useful, for example, to thermally balance the components on a PCB 100, or to force a component 110 coupled to one of the vias 108 attached to conductive path 204 to be a certain temperature. This can be achieved by coupling a heating element (or circuit component 110 that generates heat) to one via, and using conductive path 204 to thermally couple the heating element or component 110 to another component 110 thermally coupled to the other via 108.

Further, components can be coupled to another via 108 to remove the heat from that portion of PCB 100 altogether. Conductive path 206 couples one via 108 to another, and conductive path 208 couples one via 108 to the same via coupled to conductive path 206. The common via 108 is via 210. Via 210 can be coupled to an external heat sink mounted anywhere on PCB 100, or to any other heat dissipative element through use of a heat pipe or any other thermally conductive material, including other thermally conductive layer 104 or layers 104.

Figure 3:
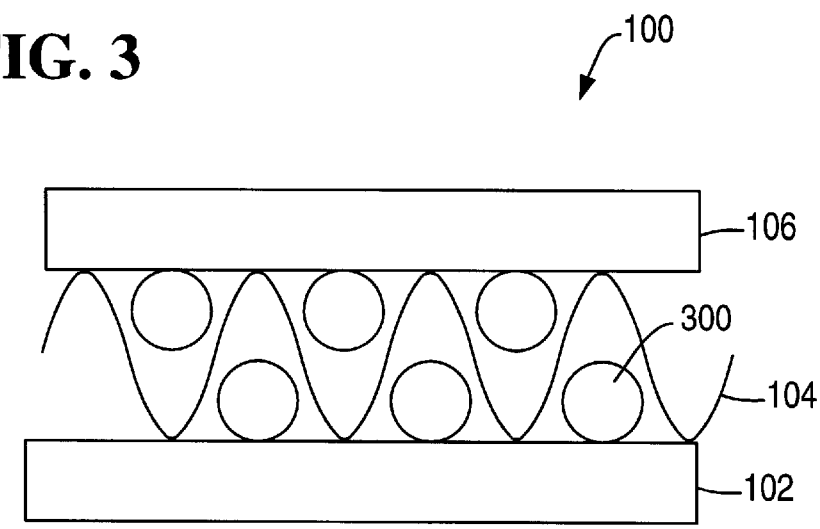
FIG. 3 illustrates a cutaway view of another embodiment of the heat strip interconnect of the present invention.

FIG. 3 illustrates a cutaway view of another embodiment of the heat strip interconnect of the present invention.

In the construction of PCB 100, layer 102 and 106 are typically compressed in some fashion, e.g., physical pressure, vacuum, glue, etc. to bind the layers 102 and 106 together. Layer 104 is typically thin, and thus, when layers 102 and 106 are compressed, layer 104 is flattened.

However, a corrugated layer 104 would serve as a better heat dissipative device or heat sink, because of the larger cross-sectional area. Heat transfer by convection Q is given by:

$$Q = Ah(T_s - T_f)$$

where A=transfer area, h=heat transfer coefficient, $T_s$=temperature of the surface, and $T_f$=temperature of the cooling fluid.

In addition to a corrugated layer 104, which is easily fabricated from foil or other thermally conductive materials, spacers 300 can optionally be placed into the peaks and valleys of corrugated layer 104 for additional thermal mass where desired. The optional spacers 300 can be thermally conductive or non-conductive, depending on the design of PCB 100. For example, some spacers 300 can be nonconductive to protect a conductive path on one of the laminate layers 102 or 106 from being electrically contacted by layer 104, or the spacer 300 can be thermally conductive to increase the thermal mass of layer 104 for heat dissipative purposes.

FIG. 4 illustrates another embodiment of the present invention. Four components 110 are mounted on PCB 100. Conductive paths 400–406, located on layer 104, are also shown. Conductive paths 400–406 show the thermal path for the heat generated by components 110. Conductive path 400 can be smaller than conductive path 402 or conductive path 404 if space is limited. Conductive path 404 is a centralized area that can be used to normalize or homogenize the temperatures of components 110. The other end of the thermal conductive path 406 is thermally coupled to a heat dissipating device, such as a heat sink, for dissipation of the heat generating components 110 to a coolant such as cooling air or cooling liquid.

The view of FIG. 4 can also be an internal view of PCB 100. For example, components 110 can be imbedded within the layers of PCB 100 as well as sitting on top or on the bottom of PCB 100. This aspect of the present invention allows even more flexibility in design of multi-layer PCBs because it allows for electrical and thermal conductive paths to run on different levels, including above and below the component 110 that is being utilized. Further, the view of FIG. 4 can be a top view of PCB 100, with components 110 being attached directly to the conductive paths 400–406, with other conductive paths used to carry electrical signals to other places on PCB 100.

FIG. 5 illustrates a two layer printed circuit board embodiment of the present invention.

PCB 100 is shown with layer 102 exposed. Layer 104 has been selectively removed to create conductive paths 500–508 and pads 510–516. Conductive path 508 is shown passing underneath component 110 with dashed lines. Connections 518–524 connect the electrical portions of component 110 with pads 510–516, and therefore electrically connect component 110 with conductive paths 500–506. Conductive path 508 is used to conduct thermal energy distinct from the electrical signals generated by component 110, and is dedicated to conducting thermal energy for component 110, as opposed to electrical energy for component 110. This allows for PCB 100 designers to use conductive paths 508 to conduct thermal energy away from hot spots on PCB 100, and to distribute the heat load on PCB 100.

Conclusion

This concludes the description of the preferred embodiment of the invention. The following describes some alternative embodiments for accomplishing the present invention. For example, the conductive paths described herein as thermal paths may not be electrically conductive; the path can then cross over an electrical path on the same layer of the PCB. Further, the PCB may use other components as heat sinks for components that generate heat. In addition, multiple layers within a PCB can be used as thermal conductivity layers.

In summary, the present invention discloses an apparatus for cooling electronic modules mounted on printed circuit boards. The apparatus comprises a thermal conduction path having one end thermally coupled to an electronic module for conducting heat away from the electronic module. The thermal conduction path comprises a thermally conductive material on the printed circuit board. The other end of the thermal conductive path is coupled to a heat dissipative device for dissipation of the heat generated by the electronic module.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A printed circuit board having multiple layers, comprising:
   a layer formed from an electrically non-conductive material;
   an electrically conductive path formed on one side of the non-conductive layer;
   a thermally conductive path formed on one side of the non-conductive layer;
   a heat-generating electronic component mounted on one of the layers of the printed circuit board;
   an electrically conductive conduit positioned to conduct electrical signals between the electronic component and the electrically conductive path; and
   a thermally conductive conduit positioned to conduct heat from the electronic component to the thermally conductive path;
   where the electrically and thermally conductive conduits are arranged so that the thermally conductive path does not carry electrical signals from the electronic component; and
   where the thermally and electrically conductive paths are formed from the same layer of material.

2. The circuit board of claim 1, where the non-conductive layer lies between the electronic component and the thermally conductive path.

3. The circuit board of claim 2, where the thermally conductive conduit includes a plated through-hole formed in the non-conductive layer.

4. The circuit board of claim 1, where the thermally conductive path is coupled to a remote heat-dissipating device.

5. The circuit board of claim 1, where the thermally and electrically conductive paths are formed on the same side of the non-conductive layer.

6. The circuit board of claim 1, where the thermally conductive path is formed from a corrugated material.

7. The circuit board of claim 1, where more than one electronic component is coupled to the thermally conductive path.

8. The circuit board of claim 7, where the thermally conductive path is configured to normalize temperatures at the electronic components.

\* \* \* \* \*